United States Patent [19]
Yoshikawa et al.

[11] 3,943,614
[45] Mar. 16, 1976

[54] METHOD OF POLARIZING HIGH MOLECULAR WEIGHT FILMS

[75] Inventors: Shinsuke Yoshikawa; Tohru Sasaki; Takao Ichii, all of Iwaki, Japan

[73] Assignee: Kureha Kagaku Kogyo Kabushiki Kaisha, Tokyo, Japan

[22] Filed: July 17, 1974

[21] Appl. No.: 489,326

[30] Foreign Application Priority Data
July 17, 1973 Japan................................ 48-79816

[52] U.S. Cl. .................... 29/25.35; 29/592; 264/22; 307/88 ET
[51] Int. Cl.² ......................................... H01L 41/22
[58] Field of Search .............. 29/25.35, 592 E, 592; 307/88 ET; 179/111 E; 264/22

[56] References Cited
UNITED STATES PATENTS

| | | | |
|---|---|---|---|
| 3,316,620 | 5/1967 | Stewart, Jr. ............................ 29/592 |
| 3,449,094 | 6/1969 | Baxt et al. ........................ 307/88 ET |
| 3,571,679 | 3/1971 | Van Turnhout ................ 307/88 ET |
| 3,696,505 | 10/1972 | Van Turnhout ...................... 29/592 |

*Primary Examiner*—Carl E. Hall
*Attorney, Agent, or Firm*—Sughrue, Rothwell, Mion, Zinn & Macpeak

[57] ABSTRACT

A method of polarizing high molecular weight films comprising polarizing elongated strips of polar high molecular weight film upon which conductive thin films as opposing electrodes are deposited on both surfaces thereof the strips being assembled in an even number of layers and wound around a core into a roll shape. An embodiment includes inserting electrically insulating spacer layers between each layer or each unit of an even number of layers to prevent discharge effects.

5 Claims, 11 Drawing Figures

METHOD OF POLARIZING HIGH MOLECULAR WEIGHT FILMS

BACKGROUND OF THE INVENTION

1. Field of the Invention

This invention relates to a method of polarizing high molecular weight film. More specifically, it relates to a method of polarization for polarizing high molecular weight film in which polarization is effected on the high molecular film wound in a specific manner around a core such as a roll, plate or the like, thereby producing a large quantity of polarized film at one time with excellent efficiency.

2. Description of the Prior Art

Methods of polarizing high molecular weight film such as polyvinylidene fluoride, polyvinyl fluoride, and the like under a static high electric field to produce piezoelectric devices, etc., are well-known. One conventional method for effecting this polarization comprises laying, while stretching, film to be polarized as plain sheets and applying a high static electric field at a prescribed temperature on the film using thin films of vapor-deposited aluminum or an electroconductive paint and the like as electrodes provided on both surfaces of the film.

The method has defects such as poor workability in the polarization, low production efficiency and the like. Since the polarization is generally effected in a heating oven, film to be polarized should be cut into a size which will fit into the heating oven (usually less than several hundred square millimeters). In addition, highly stretched film is usually used with the aim of increasing the piezoelectric and pyroelectric effects and such film must be supported by a film frame uniformly and without any slackening, which is a very difficult operation. Moreover, even if the polarization can be attained in such a way, the amount of film that can be obtained at one time is only on the order of 10 to 20 sheets with a width of 30 cm, a length of 30 cm, considering the thickness of the frame for supporting the film and using a heating oven of a volume of 90 $l$ (45 cm × 45 cm × 45 cm).

Further, in such a polarization method the electrode-forming portions, e.g., vapor deposited aluminum, must be removed along the periphery of the film in cutting and stacking the film, and additional film area must be provided for attaching the film to the supporting frame. This results in a reduction in the yields of the polarized film and production efficiency.

SUMMARY OF THE INVENTION

Various techniques for improving the foregoing conventional polarization methods which have many defects have been studied and, as a result, a polarization method has been found comprising polarizing the high molecular film to be polarized wound in a specific manner around a roll, plate or the like.

Figure 1:
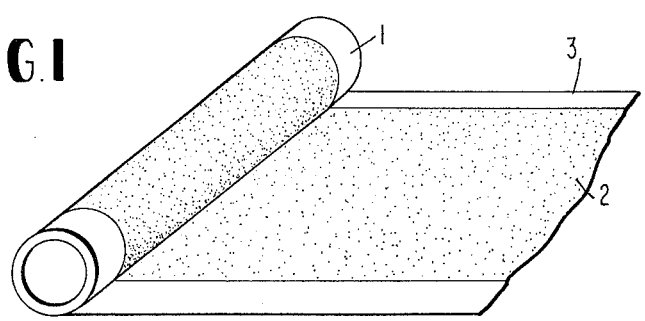
FIG. 1 is a perspective view showing a high molecular weight film upon which aluminum has been deposited on both sides.
Figure 2A:
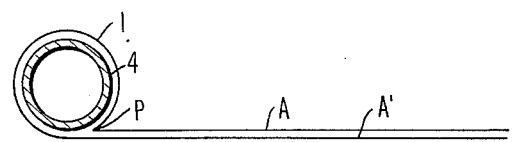
FIGS. 2 (a) to (d) are cross sectional schematic views illustrating the manner of winding the high molecular weight film in laminations around a core.
Figure 2B:
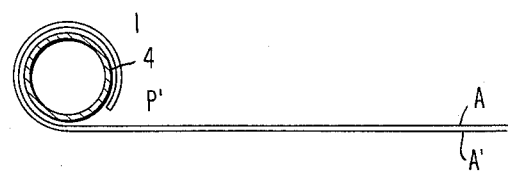
Figure 2C:
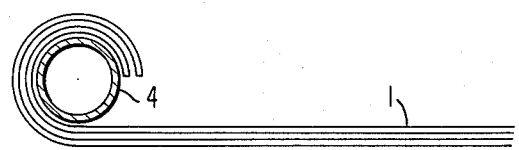
Figure 2D:

In the drawings, 1 designates a high molecular weight film, 2: an electrode, 3: a margin of the film, 4: a core, 5: a spacer film and 6: a lead for electrode 2.

DETAILED DESCRIPTION OF THE INVENTION

When elongated films provided with electrodes, e.g., of vapor deposited aluminum on both sides thereof are merely wound around a roll or the like, the opposing electrodes contact each other at the winding surface resulting in a short-circuit failure. One approach to avoid this which might be thought of would be to wind films while inserting appropriate insulating materials therebetween. However, such insulation materials should have satisfactory insulating ability at higher temperatures since a voltage under higher temperature conditions is applied and, thus, such insulating materials are restricted to only particular materials such as, for example, a thick sheet of polytetrafluoroethylene. Moreover, in using such a insulating material, if a very small amount of a gaseous layer remains between the electrode and the insulating material, an extremely high electric field intensity (KV/mm) is produced even with a slight voltage applied on this very thin air gap. This sometimes produces a corona discharge that may vaporize the electrode substance deposited as electrodes or result in pin holes in polar films. It is, however, difficult to wind polar films having electrodes deposited thereon and insulation films without air gaps into a roll form. When the voltage used for polarization is high, the thickness of the insulation sheets much be increased to keep the voltage applied on the air gap below the corona discharge voltage, this also results in a difficulty in uniformly winding them into a roll form.

This invention involves a method for polarizing at one time polar high polar high molecular weight films of elongated strips having conductive thin films such as of aluminum, nickel or the like deposited on both surfaces as electrodes, comprising stacking the polar high molecular weight films with the electrodes deposited thereon in an even number of layers, winding them simultaneously around a core such as a roll or the like and applying a high DC voltage to the electrodes to effect the polarization.

Figure 7:
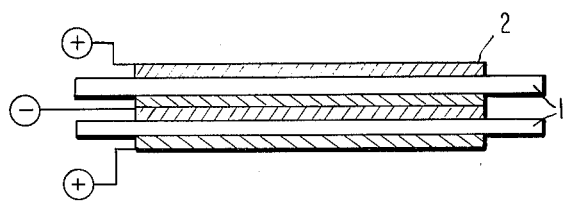
FIG. 7 is a view illustrating the high molecular weight films in laminated and polarized state.

When films as strips upon which electrodes have been deposited are stacked or assembled according to the method of this invention, as shown in FIG. 7, (which shows the case where the films are stacked in two layers), the electrodes on the respective joining or contacting faces of the films wound in a stack or laminate form of an even number of layers always have the same polarity with respect to each other and the polarization is effected under this condition where the elongated films upon which electrodes have been deposited are wound in a roll so that the faces adjacent each other have the same polarity.

As electrodes which are deposited on polar high molecular weight films, electroconductive substances such as aluminum, gold, zinc, nickel, tin and the like are used and thin films of these electroconductive materials are deposited on both surfaces of polar high molecular weight films using vapor deposition, electroplating or other similar techniques. Desirably, areas less than several millimeters in width upon which electrodes have not be deposited, are left on the periphery of one or both surfaces of the film 1 (referred to as "margin" hereinafter) as shown in FIG. 1 so as to prevent discharge in the edge portions of the films.

The method of winding around the core high molecular weight electrode deposited film in strips stacked or assembled in an even number of layers comprises, for example, as shown in FIG. 2, a method of winding an elongated film around the roll while securing the film at the midpoint of its length at P to the roll 4 FIG. 2 (a), a method of winding the film around the roll, with the film being longitudinally folded at its midpoint P', FIG. 2 (b), a method of winding two films around the core with the films being folded in their width direction (not shown) or a method of winding the films around the core while forming a stack of an even number of layers by folding an elongated film an odd number of times, FIG. 2 (c), or a method of simultaneously winding an even number of sheets of film 1 around the core FIG. 2 (d).

Any method can be employed provided that a stack of an even number of layers of electrode coated film is simultaneously wound around the core to thereby prevent short-circuits when the electrodes deposited on the opposed film faces in contact each other. When a high DC voltage is applied to the inner sides (joining faces) and outer sides (two surfaces), FIG. 7, as electrodes of the respective two films laminated in an even number of layers, no potential exists for air gaps between the electrodes, which enables polarization to be achieved without causing corona discharge destruction to the electrodes and film.

The polarization can be effected under a static electric field intensity of greater than about 50 KV/cm and less than the dielectric strength which causes yield to the insulation and at a temperature between about 40° C and 150° C similar to the conventional method in which films are polarized by overlaying them one by one in a planar manner.

With temperatures above about 150° C, the ability of the films to withstand the voltage is significantly decreased and then polarization practically becomes impossible.

In order to prevent a heat shrinking of the films in polarization under heating, preferably the ends of the films wound around the core are fixed in a suitable manner. By fixing the ends of the films, the heat shrinkage can easily be minimized at below 1% in the polarizing operation and the creasing caused by heat shrinking can be also avoided.

Figure 3:
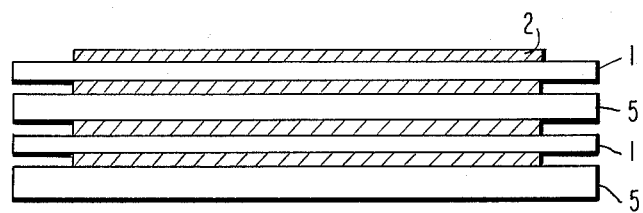
FIG. 3 is a cross sectional view showing spacer sheets inserted between the laminated film.

The polar high molecular weight films to be polarized according to the method of this invention include those copolymers essentially consisting of, for example, polyvinylidene, fluoride, polyvinyl fluoride or vinylidene fluoride or those resins such as vinyl chloride resins, vinylidene chloride resin, acrylonitrile resins and the like. Although there are no particular restrictions on the thickness of the films as long as they can be wound around the core, a thickness between about 2 to 1000 $\mu$ is suitable. Most generally, thin films of about 3 to 30 $\mu$ are used. If there are defective portions in such thin films, for example, pin holes or extremely thin portions, these defective portions often cause a short-circuit under the influence of high electric field intensity resulting in destruction of the films. The defective portions in the films not only results in a destroying of the defective portions per se but also sometimes several of the other treated films wound in a laminating roll and disposed above or beneath that portion are destroyed resulting in a reduction in the yields. In order to avoid this, preferably spacer sheets, for example, of high melting plastic film, paper, aluminum foil or the like are inserted and simultaneously wound between the opposing faces of the electrodes of the laminated film or between the stacked units of an even number of layers. By inserting spacer sheets 5 as shown in FIG. 3, between the stacked films, the destruction of the defective portions of the films in the polarization only results in a destroying of the defective portions per se or, at most, those films present between the spacer sheets and, thus, the effect of the destruction on other parts of the laminated films can be prevented.

The spacer sheets are used in such a manner that they are also wound around the core into a roll and inserted between the unit laminations of electrode deposited films of an even number of layers, or wound around the core and inserted between each film or between each unit layer of laminated film forming an even number of layers or the spacer sheets also are stacked over and under such unit laminations with spacer sheets inserted between each film or between each unit layer of film laminated in an even number of layers, or the like. If the spacer sheet is inserted between two electrodes, polarization should be effected with these electrodes adjacent the respective sides of said spacer sheet having the same polarity. The core used in this invention includes a roll, plate, rod or the like and any core can be used provided that it remains rigid under the temperature required for polarization. A cylindrical core of metal or bakelite is generally used. The metal roll is preferred among others, because it can be easily heated and cooled because of its high heat conductivity, easily quenched by water cooling the inside of the cylinder and further because the electrical contact to the film electrodes to be polarized can easily be established.

This invention is specifically described with respect to preferred embodiments thereof by reference to FIG. 1 to FIG. 7.

Figure 4:
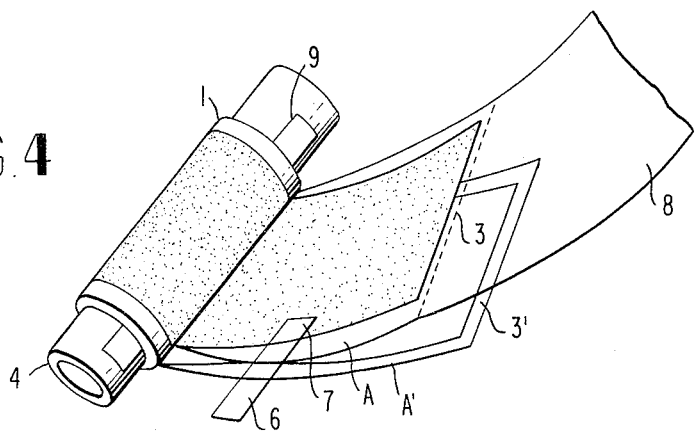
FIG. 4 is a perspective view showing the end portion of the high molecular weight film wound around a core.
Figure 5A:
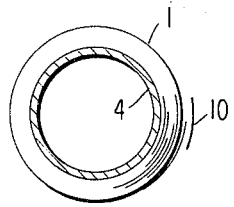
FIGS. 5 (a) and (b) are cross sectional views illustrating the manner of securing the end of the high molecular weight film wound around a core.
Figure 5B:
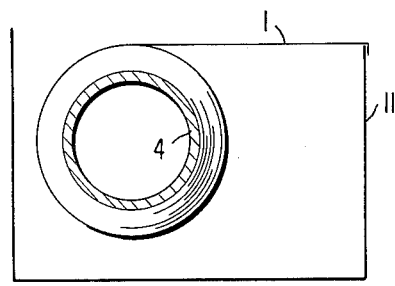

A high molecular weight film upon which electrodes are deposited is first prepared as shown in FIG. 1 by depositing onto both surfaces of a polar high molecular weight film 1 such as a film of polyvinylidene fluoride, polyvinylfluoride or the like an electroconductive coating film 2 such as a film of aluminum, nickel foil or the like using vapor deposition, electroplating or the like while leaving margins 3 of a width of about 5 to 15 mm on the periphery of the film. To wind up high molecular weight film, upon which electrodes have been deposited, laminated in an even number of layers around a core metal roll 4, electrode deposited film is prepared, for example, in two layers and they are wound around the roll 4 while laminating the two film layers A and A' as closely as possible as shown in FIG. 2 (a). A conductor 6 such as tin foil as a lead for the electrode is wound at an appropriate position on the inside of the two film layers A and A' as shown in FIG. 4. The conductor 6 is desirably wound, for example, with an electroconductive paint 7 to prevent the formation of air gaps between the portions inserted with the conductor 6 which may lead to a discharge. In FIG. 4, an insulation film 9 is used for avoiding a short-circuit between the conductor 6 and roll 4 but it is not always necessary. To prevent a heat shrinking of film during polarization, preferably the end portion of the film completely wound up around the roll 4 is secured. The securing can be effected, for example, in such a manner as connecting an insulation film 8 to the rear end of a margin 3 of the film end, further winding the insulation film 8 several turns around the roll 4 and securing its end with an adhesive tape 10 as shown in FIG. 5(a) or fixing the end of the films to a part of a frame 11 to which the core wound with the films is secured as shown in FIG. 5(b) or the like.

Film layers A and A' wound around the core as described above are connected to an electric power source and a high DC voltage producing an electric field intensity of greater than about 50 KV/cm, and less than the dielectric strength causing the insulation to yield, is applied under conditions of a temperature of above 40°C to 150°C, between the roll 4 and the conductor 6. The elongated film to which the high DC voltage is applied while laminated in a roll is polarized in such a manner that the alternate joining faces of the laminated films have different polarities.

The polarization method according to this invention which enable the polarization of film while wound around a roll, plate or the like can significantly improve the workability and produce a great quantity of polarized film with excellent efficiency as compared with prior methods in which polarization is effected while overlaying the film in a flat condition. In addition, the present method makes it possible to obtain stable properties in that the heat shrinkage can be easily reduced to below 1%, quenching can be conducted, etc.

The following example are given to illustrate the invention in greater detail.

EXAMPLE 1

Figure 6:
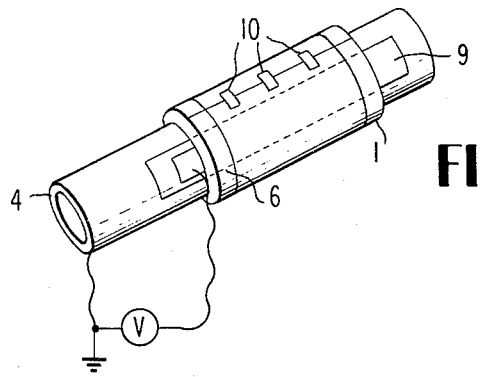
FIG. 6 is a view illustrating the voltage application for effecting polarization of the high molecular weight film.

Aluminum was vapor-deposited onto a mono-axially stretched film of polyvinylidenefluoride of a thickness of 30 $\mu$ as shown in FIG. 1 and the winding of the film was started as shown in FIGS. 2 and 3. After similtaneously winding two sheets of this film of about 20 m, a lead for the electrode was provided as shown in FIG. 4 and polarization was effected by applying a DC potential of 600 V (200 KV/cm) as shown in FIG. 6. The polarization was conducted in a dry vessel and the films were kept at a temperature of 115°C for 30 minutes and then allowed to cool. The piezoelectric constant $d_{31}$ thus obtained was $2.5 \times 10^{-7}$ cgs esu.

EXAMPLE 2

Aluminum was vapor-deposited onto a mono-axially stretched film of polyvinylidenefluoride of a thickness of 7 $\mu$ as shown in FIG. 1 and wound around a stainless steel tube having an outer diameter of 100 mm together with polyester films of a thickness of 9 $\mu$ laid between two sheets of the film and on the outer side thereof. After winding about 20 $m$ these sheets, a lead for the electrodes was provided as shown in FIG. 4 and a DC potential of 490 V (700 KV/cm) was applied to effect polarization as shown in FIG. 6. The polarization was conducted in a dry vessel and the film was kept at a temperature of 115°C for 30 minutes and then was cooled by passing cold water through the stainless tube. While puncture resulted at the defective portions present in the polyvinylidene-fluoride films the other portions of the laminated polyvinylidenefluoride film which was screened with the polyester films was not affected and the generation of pin holes occurred only in these defective portions.

On the contrary, where the same polyvinylidenefluoride film of a thickness of 7 $\mu$ was laminated and polarized without using spacer sheets, the puncture produced in the defective portions of this film spread to other portions of the laminated film to thereby reduce the yield. The piezoelectric constant $d_{31}$ thus obtained was $7.2 \times 10^{-7}$ cgs esu.

Numerous modifications of the invention will become apparent to one of ordinary skill in the art upon reading the foregoing disclosure. During such a reading, it will be evident that this invention provides a unique apparatus and method utilizing wet-developing for accomplishing the objects and advantages hereinstated.

We claim:

1. In a method of polarizing high molecular weight films comprising the steps of depositing conductive thin films as opposing electrodes on both surfaces of elongated strips of polar high molecular weight film material and polarizing said film strips, the improvement comprising: assembling the strips in an even number of layers and winding the assembled strips around a core into a roll shape and applying a D.C. potential across said electrodes with each two facing electrodes having the same polarity and alternating the polarity of the groups of facing electrodes of said assembly.

2. The method as claimed in claim 1, further comprising the step of inserting a spacer sheet between the two facing electrodes of each of said groups of said assembly.

3. The method as claimed in claim 1, further comprising the step of inserting a spacer sheet of electrically insulating material between the facing surfaces of said two electrodes of each group prior to winding said assembly.

4. The method as claimed in claim 1, further comprising the step of inserting an aluminum foil spacer sheet between the facing surfaces of said two electrodes of each group prior to winding of said assembly into roll shape.

5. The method as claimed in claim 1, further comprising the step of inserting a spacer sheet between the two facing electrodes of each group and further assembling spacer sheets overlying and underlying said assembled strips prior to winding of the thus assembled strips around a core into roll form and applying of a D.C. potential across the electrodes such that the electrodes situated on both sides of a given spacer sheet have the same polarity.

* * * * *